US006323097B1

(12) United States Patent
Wu et al.

(10) Patent No.: US 6,323,097 B1
(45) Date of Patent: Nov. 27, 2001

(54) ELECTRICAL OVERLAY/SPACING MONITOR METHOD USING A LADDER RESISTOR

(75) Inventors: Shien-Yang Wu; Tseng Chin Lo; Konrad Young, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/590,183

(22) Filed: Jun. 9, 2000

(51) Int. Cl.$^7$ .................................................. H01L 21/20
(52) U.S. Cl. ..................... 438/384; 438/107; 438/210; 438/257; 438/773; 438/776; 438/324; 438/763; 438/765
(58) Field of Search ..................................... 438/107, 210, 438/384, 381; 257/48, 401, 776, 773; 324/765, 763

(56) References Cited

U.S. PATENT DOCUMENTS

| 4,918,377 | 4/1990 | Buehler et al. .......................... 324/691 |
| 5,383,136 | 1/1995 | Cresswell et al. ....................... 364/561 |
| 5,602,492 | 2/1997 | Cresswell et al. ....................... 324/763 |
| 5,617,340 | 4/1997 | Cresswell et al. ................... 364/571.01 |
| 5,699,282 | * 12/1997 | Allen et al. ......................... 364/571.01 |

* cited by examiner

Primary Examiner—Charles Bowers
Assistant Examiner—Hsien-Ming Lee

(74) Attorney, Agent, or Firm—George O. Saile; Stephen B. Ackerman

(57) ABSTRACT

A method and structure is disclosed to measure spacing and misalignment of features in semiconductor integrated circuits. Three equally spaced, parallel first level conductive lines are formed on a first insulating layer with staircase patterns projecting both out of and into the inner edges of the outer lines. A second insulating layer is deposited and step contact vias are opened through the second insulating layer over the steps of the staircase patterns. The inner edge of the step contact via coincides with the inner edge of the step. Contact pad vias are opened through the second insulating layer over the outer lines and the step contact vias and the contact pad vias are filled with conductive material. A second level conductive line is formed over the second insulating layer parallel to said first level conductive lines and above the central first level conductive line. Resistor ladder patterns are formed projecting from both edges of said second level conductive line, the rungs of said ladder patterns being of equal length and being composed of rung conductive sections with a resistor section interposed. A center conductor contact pad is formed electrically connected to the second level conductive line. A right conductor contact pad is formed over the right contact pad via and a left conductor contact pad is formed over the left contact pad via. The resistances between the center conductor pad and the right conductor pad and between the center conductor pad and left conductor pad are measured. From these resistances are inferred which rungs of the resistor ladder patterns make contact with step contact vias of the outer first level conductive lines. This infers bounds for the distances, SR and SL, from the right and left outer first level conductive lines to the second level conductive line. Spacing and misalignment are calculated from these distances.

35 Claims, 5 Drawing Sheets

ELECTRICAL OVERLAY/SPACING MONITOR METHOD USING A LADDER RESISTOR

BACKGROUND OF THE INVENTION (1) Filed of the Invention

The present invention relates generally to semiconductor integrated circuit manufacturing and more particularly to methods and structures for monitoring and controlling overlay and spacing.

(2) Description of Prior Art

As design rules shrink there are increased accuracy requirements for the alignment of features on successive wafer levels and for the separation of features on a single level; i.e. for overlay and spacing. To meet these requirements overlay and spacing need to be monitored and controlled. The prior art includes various electrical test structures and methods for this purpose. Resistive and van der Pauw bridges are used with features whose relative alignment is desired forming elements of the bridge. The bridge test structure is designed so that for exact alignment a null result is obtained; e.g. equal voltages across the features being compared. The degree of misalignment is ascertained by the difference in the voltage measured across the features. Voltages across features are often small, especially when their resistance is low. Differences in voltage across features needed to detect small misalignments are smaller yet. Thus special equipment and techniques are required to achieve the required sensitivity in the voltage measurements. In addition, elaborate test structures, testing procedures and algorithms are needed to extract quantitative misalignment results from measured voltages. Cresswell et al., in U.S. Pat. No. 5,383,136 disclose an electrical test structure and method for measuring the misalignment of conductive features on an insulating substrate. A bridge method is used and misalignment is proportional to the difference in voltage across features being compared. The test structure is designed so that effects of the test structure geometry can be measured and compensated for using a succession of test signals and inserting the measured response voltages in provided algorithms. These elaborate structures and procedures, as well as high precision voltage measurements are required to achieve the fine resolution needed for submicron design rules. U.S. Pat. No. 5,602,492 to Cresswell et al., a continuation-in-part of U.S. Pat. No. 5,383,136, teaches a method of eliminating random errors arising from imperfections. U.S. Pat. No. 5,617,340 to Cresswell et al. and U.S. Pat. No. 5,699,282 to Allen et al. are continuations-in-part of the above patents and involve methods for measuring misalignment, which require a multiplicity of test structures and a multiplicity of precision measurements. Buehler et al. in U.S. Pat. No. 4,918,377 teach a method of determining the reliability of conductors deposited on an uneven surface. The method involves measuring the resistance of a test structure in which the conductors are deposited over a multiplicity of steps.

SUMMARY OF THE INVENTION

Accordingly, it is a primary objective of the invention to provide simple test structures and methods for measuring overlay and spacing that could be achieved without resort to a multiplicity of measurements and to extreme precision. To achieve this objective ladder resistors are used. Traditionally, the dimension of a feature is inferred from the resistance of the feature. Thus, small differences in length correspond to small differences in resistance and the resolution of small differences requires precise resistance measurements. In the method of the invention, length is inferred from the ladder-rung dimension and from the number of rungs that have made electrical contact. The rungs are electrically in parallel and could have the same resistance so that a significant resistance difference exists if a rung has or has not made contact. There is therefor no need for very sophisticated resistance measurements.

Embodiments of the invention relate to measurement of the spacing of parallel conductive lines, which are on the same level of an integrated circuit semiconductor chip. Rungs of equal length, L and of equal resistance, r are disposed perpendicular to the lines and contacting one of the lines, the ladder reference line. A staircase pattern is constructed with its base along a neighboring line. The step facing a rung is closer to the ladder reference line then the step below it by a chosen distance, d that is a fraction of L. The resistance between the ladder reference line and the neighboring line is r/n, n being the number of rungs making contact with the staircase pattern of the neighboring line. Then it can be inferred that the distance from the reference line to the nth step of the staircase pattern is between L−d and L. If the edge of the line corresponds to the mth step then the spacing between the ladder reference line and the neighboring line is between L+(m−n−1)d and L+(m−n)d. The total number of rungs, N, and r should be chosen so that r/N is an easily measured resistance. The lowest resistance to be encountered, resulting when all rungs make contact, is r/N. Spacing between features other than parallel lines can be accomplished in the same method as for parallel lines by appropriate replication and connection of the features. An alternative method of measuring the spacing of parallel lines on the same level of an integrated circuit semiconductor chip does not require a step pattern. Instead the rung length is incremented. The rung resistance can be arranged to be unaffected by the change in length by inserting a sufficiently large resistance in each rung. Then the situation is essentially the same as when equal rungs are used with a staircase pattern and the results are the same.

Other embodiments of the invention relate to misalignment of features on different levels. The case of parallel lines on adjoining levels, which should coincide for perfect alignment, is a typical situation; other situations can be treated similarly. Three parallel, equally spaced conducting lines are deposited on the first level. Staircase patterns are constructed along the inner edges of the outer lines, with step increment, d. An insulating layer, which separates the levels, is deposited; its upper surface defining the second level. A conductive line is deposited on the second level. For perfect alignment this line would coincide with the central line of the first level. Ladders are deposited on the second level, with conductive rungs of length L, and resistance r, emanating from both sides of the second level line. Vias had been opened through the insulating layer at the end of each rung so that the separation between the outer edge of the via and the end of the rung is much less than d, the incremental staircase distance. The vias had been filled with conductive material, preferably the same material as the lines, and they contact the second level ladders. Two resistances are measured, between the second level line and each of the outer first level lines. A measured resistance of r/n between the second level line and an outer first level line indicates that the nth step of the staircase pattern of that fist level line is between L−d and L from the edge of the second level line. If the edge of the mth step corresponds to the edge of the line then the separation between the neighboring edges of the second level line and that first level line is between L+(m− n−1)d and L+(m−n)d. Let m and n be as defined for the first level line on the right, p and q the corresponding meanings for the first level line on the left. The second level lines are translated with respect to the first level lines by an amount which is between (m−n−p+q+1)d/2 and (m−n−p+q−1)d/2, with the translation being to the left for positive values and to the right for negative values. The spacing of the first level lines is between L+(m−n+p−q)d/2 and L+(m−n+p−q−2)d/2. Alternatively, instead of staircase patterns on the first level lines, the length of the rungs of the two second-level ladders can be incremented and the rung resistance kept constant. Resistance measurements between the second level line and each of the outer first level lines can be used in the same way as when the staircase patterns were used to obtain the first level spacing and line pattern translation bounds.

A method and structure is disclosed to measure spacing and misalignment of features in semiconductor integrated circuits. Three equally spaced, parallel first level conductive lines are formed on a first insulating layer with staircase patterns projecting both out of and into the inner edges of the outer lines. A second insulating layer is deposited and step contact vias are opened through the second insulating layer over the steps of the staircase patterns. The inner edge of the step contact via coincides with the inner edge of the step. Contact pad vias are opened through the second insulating layer over the outer lines and the step contact vias and the contact pad vias are filled with conductive material. A second level conductive line is formed over the second insulating layer parallel to said first level conductive lines and above the central first level conductive line. Resistor ladder patterns are formed projecting from both edges of said second level conductive line, the rungs of said ladder patterns being of equal length and being composed of rung conductive sections with a resistor section interposed. A center conductor contact pad is formed electrically connected to the second level conductive line. A right conductor contact pad is formed over the right contact pad via and a left conductor contact pad is formed over the left contact pad via. The resistance between the center conductor pad and the right conductor pad is measured. From this resistance is inferred which rungs of the resistor ladder pattern, projecting from right edge of the second level conductive line, make contact with step contact vias of the outer first level conductive line on the right. And determining from this the bounds for the distance, SR, from the right outer first level conductive line to the second level conductive line. The resistance between the center conductor pad and the left conductor pad is measured. From this resistance is inferred which rungs of the resistor ladder pattern, projecting from left edge of the second level conductive line that make contact with step contact vias of the outer first level conductive line on the left. And determining from this the bounds for the distance, SL, from the left outer first level conductive line to the second level conductive line. The bounds for the spacing of the first level conductive lines are calculated from (SR+SL)/2 and the misalignment between the central said first level conductive line and said second level conductive line is calculated from (SR−SL)/2.

BRIEF DESCRIPTION OF THE DRAWINGS

In the accompanying drawings, forming a material part of this description there is shown.

DESCRIPTION OF THE PREFERRED EMBODIMENTS

Figure 1:
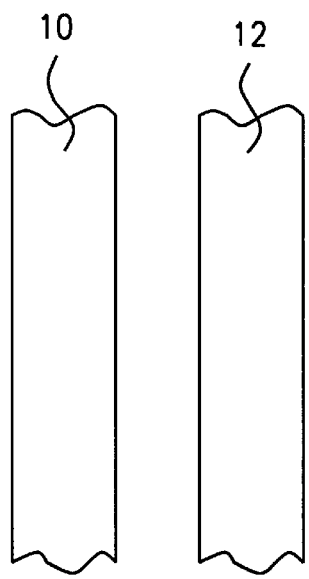
FIG. 1 shows parallel lines whose separation it is desired to measure.
Figure 2:
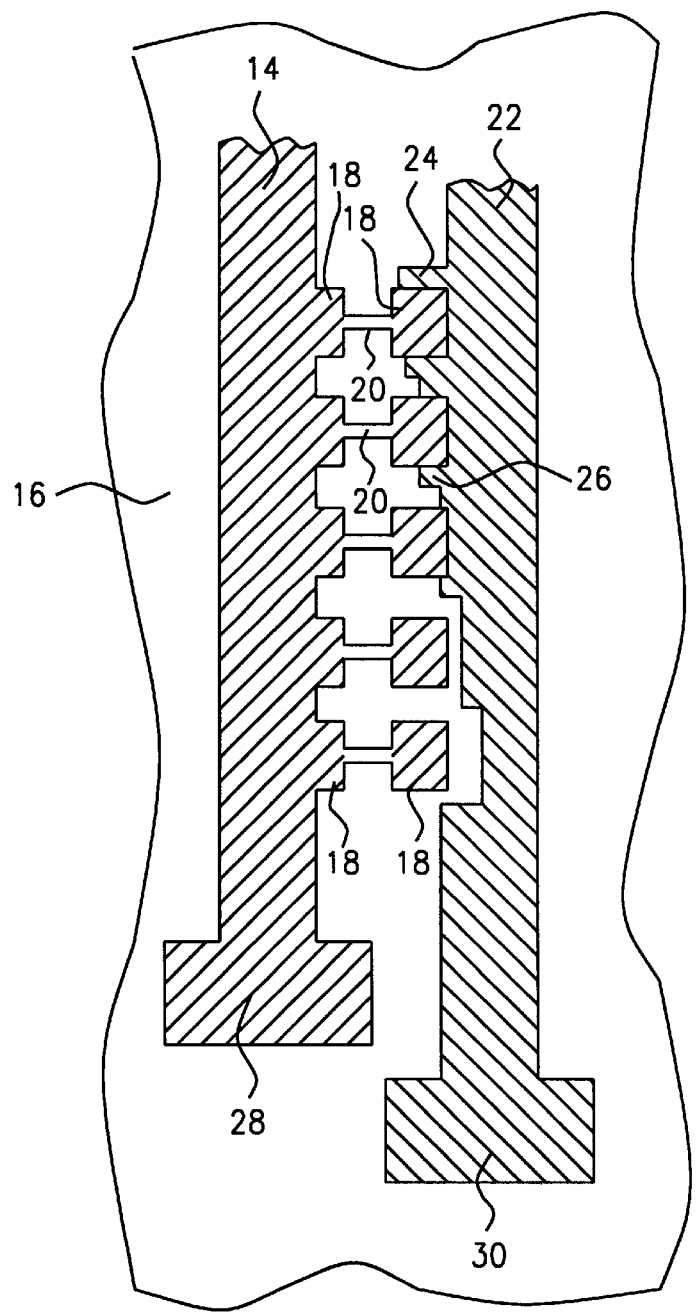
FIGS. 2 and 3 show embodiments of the invention for measuring spacing.

Referring to FIG. 1 there is shown a typical situation where preferred embodiments of the invention are to be utilized. It is desired to measure the separation between parallel lines 10 and 12 to determine if the manufacturing process is under control with respect to the spacing of the lines. A simple, efficient and reliable method is required to ascertain if the line spacing is within design tolerance. FIG. 2 shows a test structure according to a preferred embodiment of the invention, that constitutes such a method. Line 14 is a conductive replica, deposited on insulating layer 16, of a segment of line 10. Rungs 18, of equal length, L, emanate from the line 14. They are composed of conducting sections of negligible resistance compared with an interposed resistor section 20, of resistance r, which for preferred embodiments of the invention is the same for all rungs. Conductive line 22 deviates in shape from line 12 in that its inner edge is composed of a staircase pattern 24. Steps of the staircase pattern are arranged opposite rungs emanating from line 14 so that only one rung can ever contact a step. The spacing between one step, 26, of the staircase pattern and line 14 is intended to replicate the spacing between lines 10 and 12. The spacing between steps, d, is the same for all steps. Pads 28 and 30 allow for electrical connection to measure the resistance between the pads.

The rung resistors 20 are chosen so that their resistance, r, is much greater than the resistance of the lines 14 and 22 and of the conductive rung sections. Measured resistances between the pads 28 and 30 will be of the form r/n, where n is the number of rungs emanating from line 14 making contact with steps of line 22. If a resistance r is measured, only the closest step makes contact with a rung and that step is then closer to line 14 than the rung length, L, but further than L−d, because otherwise the next step would also make contact. If step 26, which was made to correspond with the inner edge of line 12, is the mth step then it is (m−1)d further from line 14 than the first step. So a measured resistance equal to r indicates that the spacing between lines 10 and 12 is greater than L+(m−2)d and less than L+(m−1)d. Generally, with the mth step being step 26, a measured resistance of r/n indicates that the separation of lines 10 and 11 is greater than L+(m−n−1)d and less than L+(m−n)d. In practice the rung length, L, is chosen to be about equal to the mean or nominal value of the line separation and d is chosen to be about equal to the standard deviation or some other appropriate fraction of the expected spread of line separation values. Since the test structure is so simple and only one standard resistance measurement is required per structure, many structures can be efficiently fabricated and measured. With the above choices for L and d and with the number of rungs even as low as five, statistically significant results are readily obtained.

Figures 3, 4:
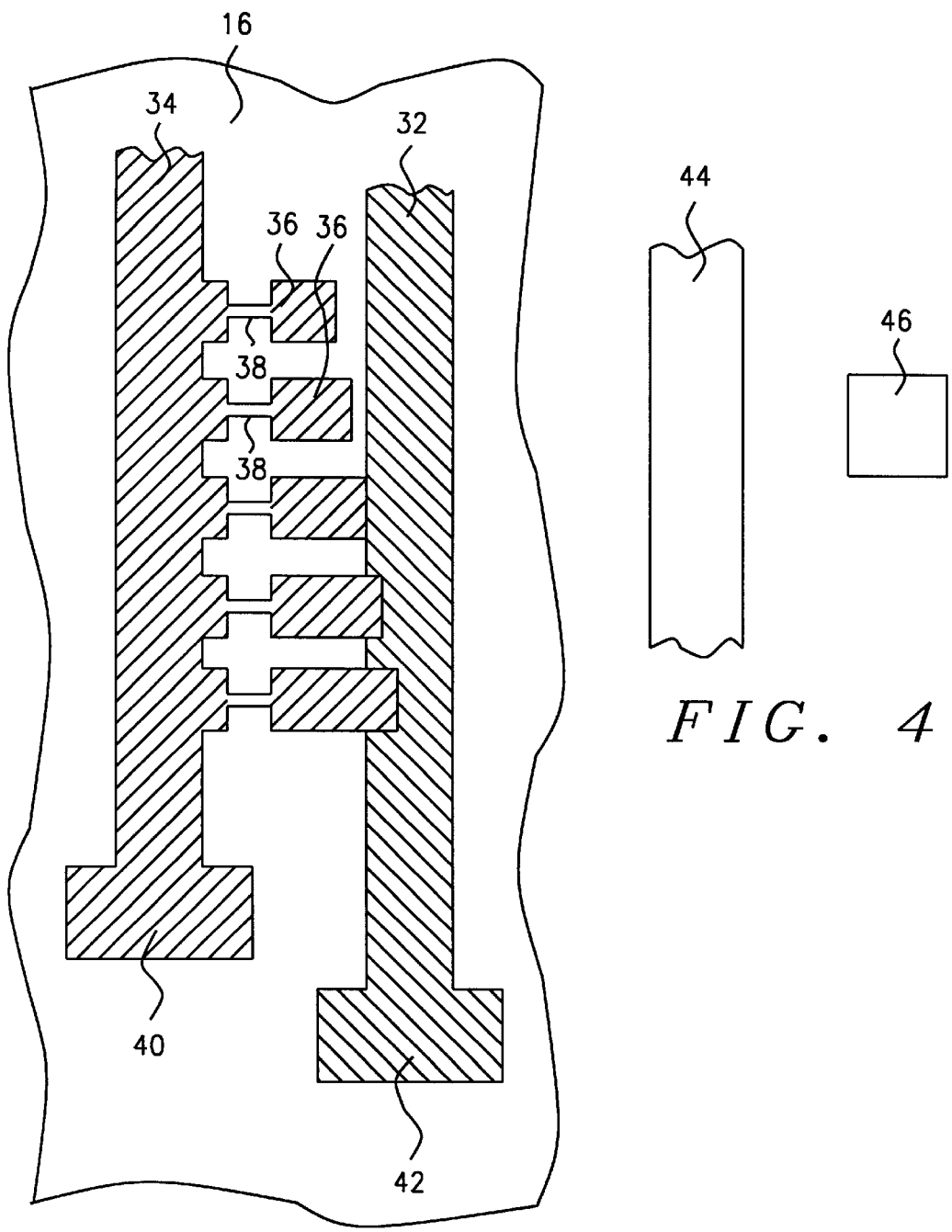
FIGS. 4 and 5 indicate the method of the invention for features other than parallel lines.

Another preferred embodiment of the invention for measuring spacing is illustrated in FIG. 3. Line 32 is a conductive replica of line 12, and is deposited on an insulating layer, 16. Conductive line 34, separated from line 32 by the spacing of lines 10 and 12, is similar to line 14 but the rungs 36 emanating from its inner edge are not of equal length.

They are composed of sections of high conductance with interposed resistor sections 38, which dominate the resistance of the rest of the structure and, in preferred embodiments of the invention, are of equal resistance for all rungs. The rung length is incremented by a distance d. Without loss of generality, the rungs can be arranged so that a rung, the mth, has length L and that they increase by the increment d from bottom to top. Resistance measurements are accomplished utilizing pads 40 and 42. If the rung resistance is denoted r, resistance between line 32 and 34 will be r/n, when n rungs contact line 32. Then the separation of lines 32 and 34, and by design of lines 10 and 12, is between L+(m−n−1)d and L+(m−n)d.

In other embodiments of the invention rung resistance need not be the same for all rungs. For example, it may be desirable to maintain as constant the increment in the line-to-line resistance when an additional rung makes contact. Denote this line-to-line resistance as D, and the resistance of the first rung to make contact as r. When n rungs make contact the resistance is r−(n−1)D. To achieve this, the resistance of the first rung to make contact is r, of the second is r(r−D)/D and of the nth is (r−(n−2)D)(r−(n−1)D)/D. The measured resistance determines the number of rungs making contact and the analysis to infer the spacing is exactly as before.

Figure 5:
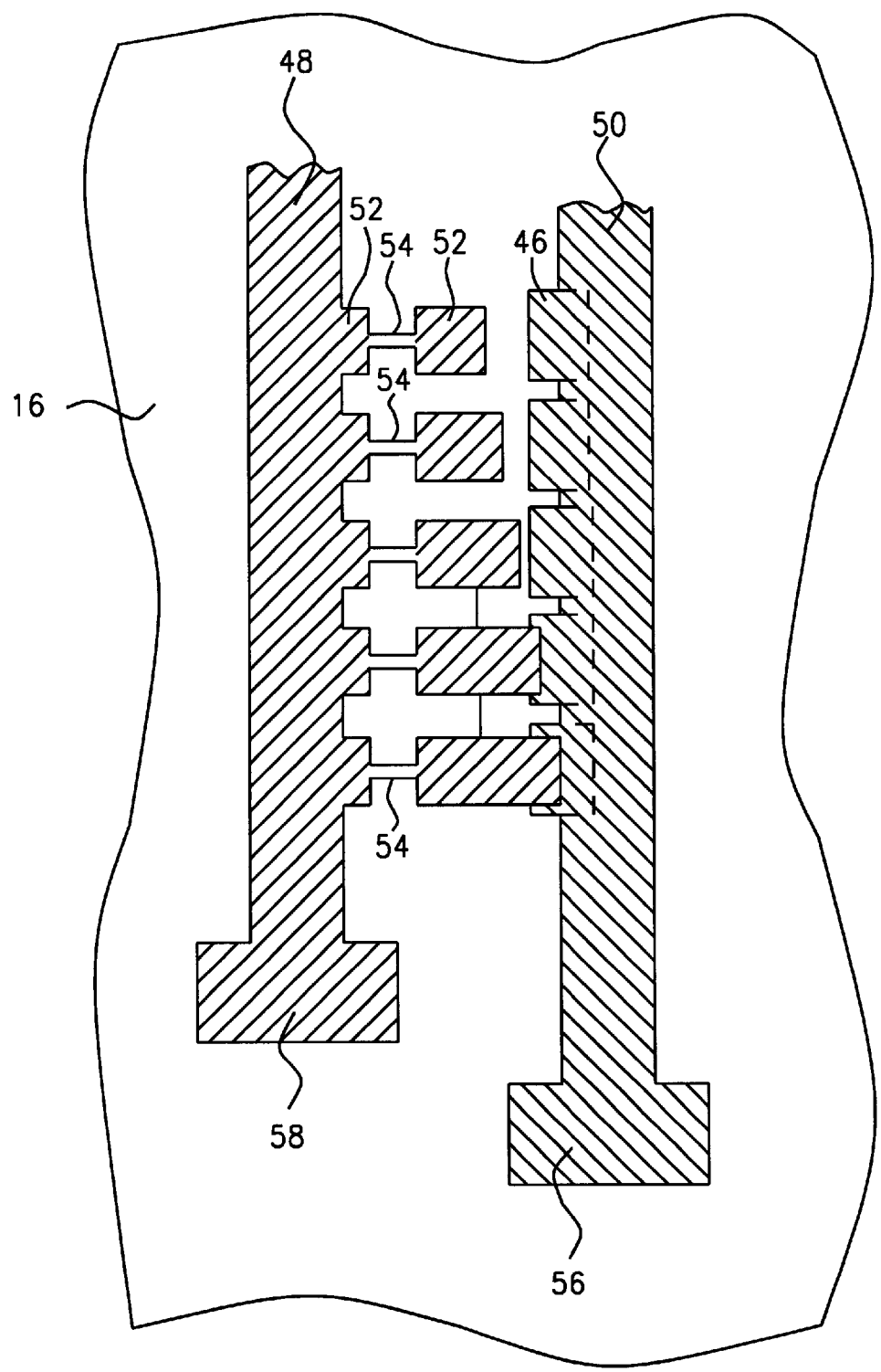

Spacing of features other than parallel lines can be determined from the methods of the invention. For example, the distance between a line, 44, and via, 46, which are shown in FIG. 4, can be determined as illustrated in FIG. 5. Conductive line 50 connects conductive replicas of via 46. A ladder pattern emanates from conductive line 48, whose rungs are conductive sections 52 with a resister section 54 interposed. The rung lengths are incremented by a distance, which is a fraction of the spread of acceptable spacing, and the length of a central rung is about equal to the nominal spacing. Pads 56 and 58 allow for resistance measurements from which the spacing can be inferred, exactly as described in detail for parallel lines.

Figure 6:
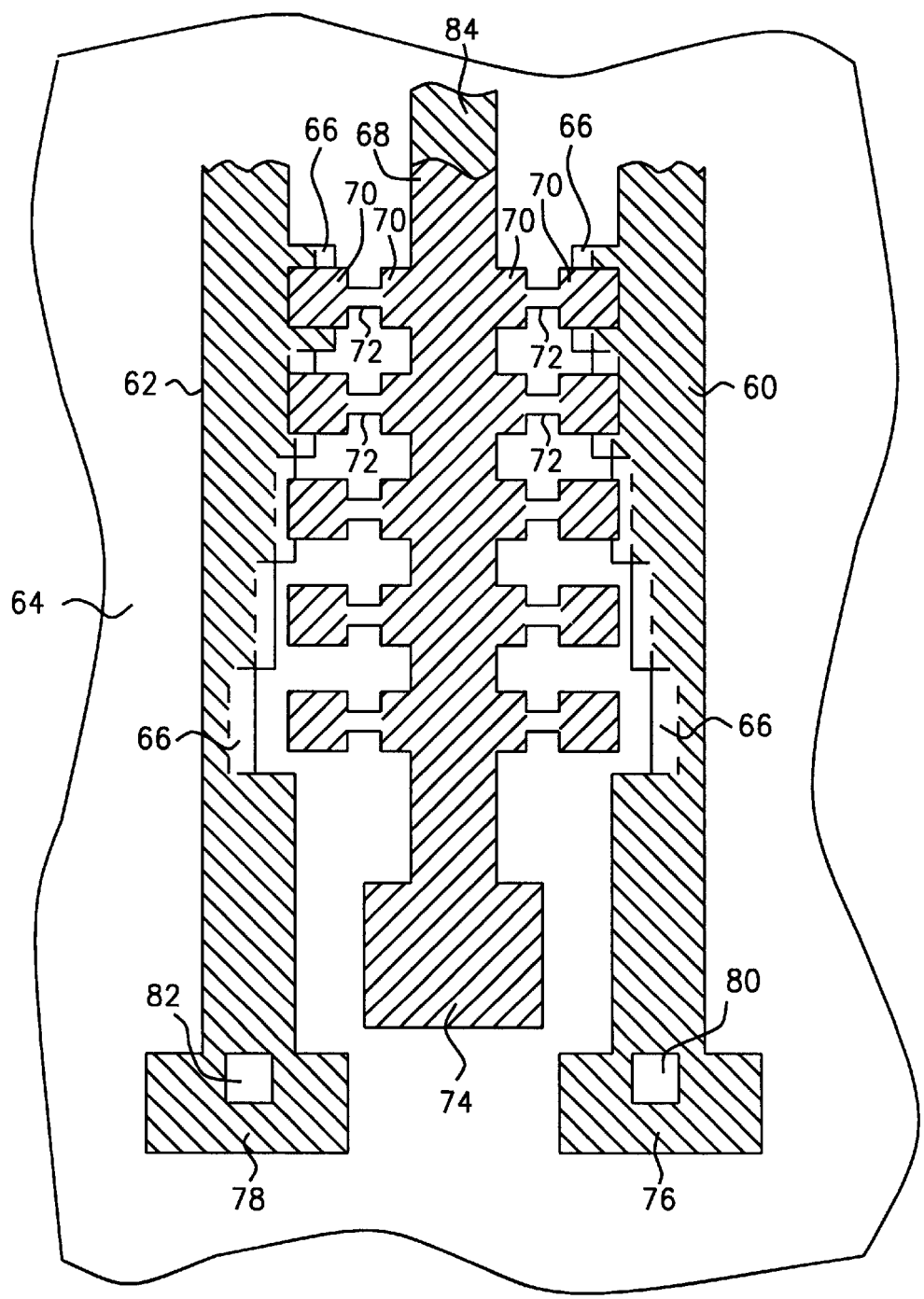
FIG. 6 indicates the characteristics of the measured resistance.

Other preferred embodiments of the invention refer to misalignment of features on different levels of an integrated circuit semiconductor chip. Essentially, it is desired to ascertain the relative translation of features on different levels. Parallel lines will be discussed explicitly, but, as indicated in the case of spacing, other features can be treated similarly. In FIG. 6 there is shown a test site according to a preferred embodiment of the invention. Parallel conductive lines 60, 62 and 84 are deposited on an insulating layer and constitute the first level metal. Line 84 is nominally just below the second metal line 68. There is a staircase pattern emanating from the inner edges of both outer lines. One step of the test pattern on line 60, denoted the mth, is set to be at the edge of a chip line that is being represented and similarly for the pth step of line 62. For similar staircase patterns p=m. The steps are incremented by a distance d. An insulating layer 64 is then deposited on whose upper surface will be deposited the second level metal. Vias, 66, are opened through insulating layer 64 at each step of the staircase patterns of lines 60 and 62, such that the inner edge of the via coincides with the edge of the step. The vias are filled with a conductive material such that contact would be made with rungs, to be deposited subsequently, that reach the vias' edges. Conductive line 68 and resistance ladder structures emanating from both its edges is deposited as the second level metal. Line 68 is situated to be just above line 84. Rungs of both resistive ladder structures consist of conductive sections, 70, with a resistive section 72 interposed. The resistance of the resistive section 72 is much larger than that of the rung conductive sections and the lines. The length L of each rung is chosen to be about the nominal line spacing. Pads 74, 76 and 78, all on the second level, provide the means to make the required resistance measurements. Vias 80 and 82, through the insulating layer separating the first and second metal levels, are filled with conductive material to establish electrical contact between pads 76 and 78 and lines 60 and 62, respectively. Two resistances are measured, between pads 74 and 76 and between pads 74 and 78.

The resistances uniquely determine which are the steps contacting rungs. For instance, if the rung resistance were the same value, r, for all rungs than a resistance of r/n would indicate that the n highest steps were contacting rungs and the others were not. Recall that the rung length is L and d is the increment. Thus, a measured resistance of r/n indicates that the distance of the nth step from the facing edge of line 68 is larger than L−d but less than L. From the resistance between pads 74 and 76, the n steps of the staircase pattern on line 60 making contact are identified, and, from the resistance between pads 74 and 78 the q steps of the staircase pattern on line 62 making contact are identified. The spacing, SR, between lines 68 and the mth step of the staircase pattern of 60 is therefor between L+(m−n−1)d and L+(m−n)d. Similarly, the spacing, SL, between lines 68 and the pth step of the staircase pattern of line 62 is between L+(p−q−1)d and L+(p−q)d. The spacing of the first level lines is obtained from (SR+SL)/2. Using the results above for SR and SL this is between L+(m−n+p−q−2)d/2 and L+(m−n+p−q)d/2. Misalignment is obtained from (SR−SL)/2 and is between (m−n−p+q−1)d/2 and (m−n−p+q+1)d/2. Positive misalignment indicates a translation of line 68 toward line 62.

Figure 7:
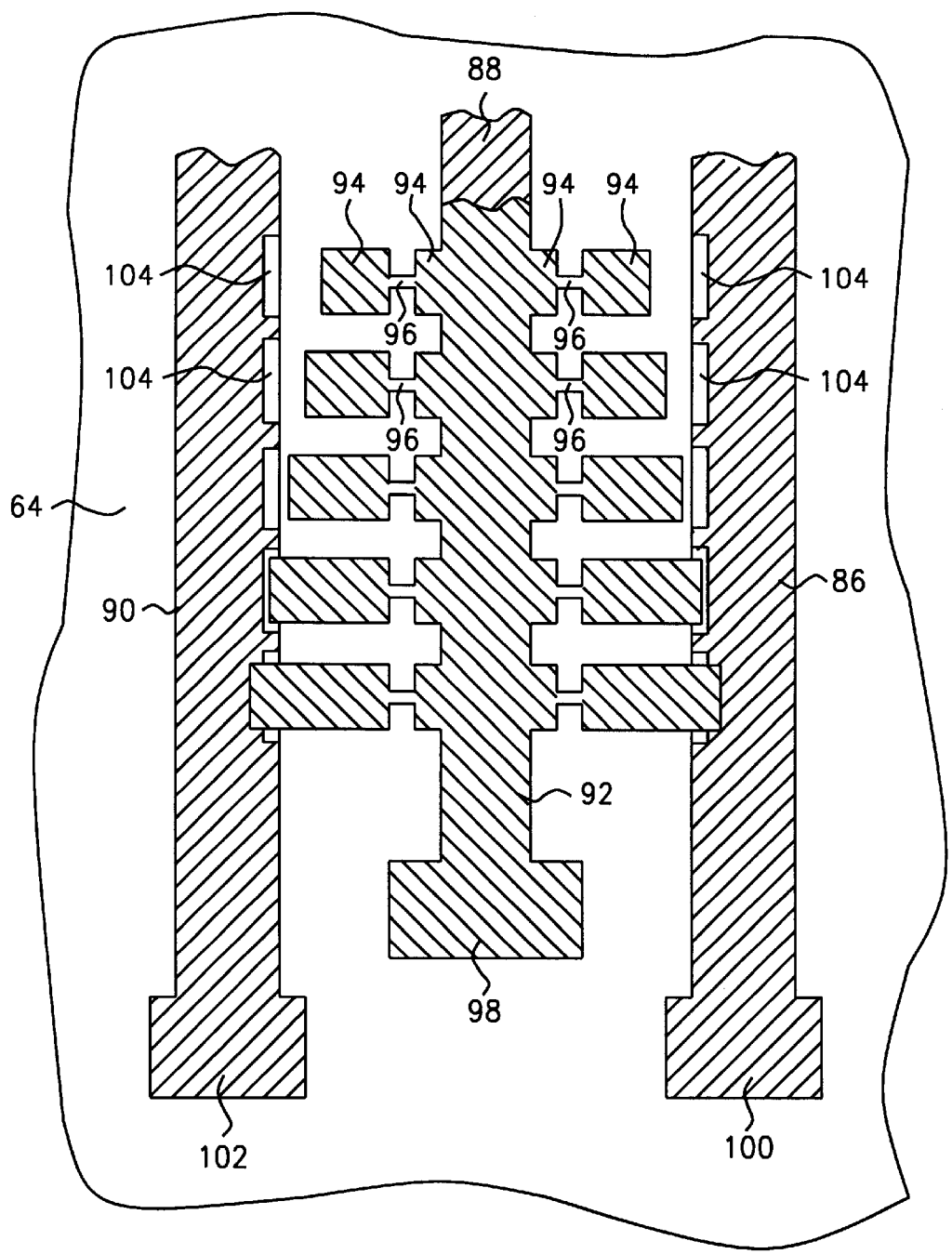
FIG. 7 shows an embodiment of the invention for measuring misalignment.

Another preferred embodiment for the determination of misalignment and spacing is illustrated in FIG. 7. In this embodiment staircase patterns are not used on the first level lines, instead the length of the rungs on the second level ladder structures are incremented. In the test structure shown in FIG. 7, conductive lines 86, 88 and 90 are deposited on an insulating layer 64. Their spacing is designed to be that of the chip lines whose spacing is being monitored. Pads 100 and 102 are connected to lines 86 and 90, respectively. A second insulating layer is deposited. Vias, 104, are opened and filled with conductive material. The vias are situated so that the edge facing line 92 is coincident with the edge of the first level line it connects to, and so that it would connect with only one rung, emanating from line 92 that happens to reach it. Line 92, connected pad 98, and ladder resistor structures emanating from both edges are deposited on the second insulating layer. Line 92 is perfectly aligned when it lies directly above line 88. Rungs emanating from the edges of line 92 is comprised of conductive sections 94 and an interposed resistor section, 96. The rungs on both ladders are incremented by a distance d, and the length of one rung on each ladder is about equal to, L, the nominal line spacing. Resistance measurements, between pads 98 and 100, and between pads 98 and 102, indicate the rungs that contact either the vias of line 86 or of line 90. Number the rungs on both ladders in order of decreasing length and denote the rung of length L as the mth for the ladder on the line 86 side and as the pth rung for the ladder on the line 90 side. If the shortest rung making contact with vias of line 86 is n and with vias of line 90 is q, then the distance from line 92 to line 86, denoted SR, is between L+(m−n−1)d and L+(m−n)d, and the distance from line 92 to line 90, denoted SL, is between L+(p−q−1)d and L+(p−q)d. The misalignment and first level line spacing are obtained from (SR−SL)/2 and (SR+SL)/2, respectively. Therefor the misalignment is between (m−n−

$p+q-1)d/2$ and $(m-n-p+q+1)d/2$ and the spacing is between $L+(m-n+p-q-2)d/2$ and $L+(m-n+p-q)d/2$.

Processing procedures to fabricate the test structures of the preferred embodiments are well known to those versed in the art. Generally processing of components of the test structures should be similar to that of the corresponding features in the chip. Insulating layers 16, 64 and the second layer of the two layer metal embodiments can be any of the dielectric materials used for such layers in semiconductor integrated circuit manufacturing. Doped and undoped SiO2, Si3N4, and Silicon oxynitride are commonly used dielectric materials. Deposition methods include APCVD, LPCVD, LPCVD TEOS, O3-TEOS CVD, PECVD, UHVCVD and ECRCVD. Insulating layers should be reasonably planer and the thickness of the interlevel insulating layer could be about that of the corresponding layer in the chip. Conductive lines and regions could be comprised of material such as polysilicon, Al, Cu, Ag, Au, W, Mo, Ti, Co, TiN, MoSi2, WSi2, CoSi2 and TiSi2, which are generally deposited by sputtering or CVD. Patterning procedures to form lines, staircase structures, ladder resistor structures, vias and pads are well known to those versed in the art. Line width and spacing should be about that in the chip, which in modern integrated circuits could be less than one micron. The width of the steps on staircase patterns and of rung conductive regions could be about the same as the line widths. Vias through the interlevel insulating layer should have close to vertical sidewalls, which can be achieved by opening the via using anisotropic etching methods well known to those versed in the art. The vias are filled with conducting materials, such as W, TiN, AL or polysilicon, forming a plug. Details of plug forming processes are well known to those skilled in the art. Rung resistor sections could be thin film deposited resistors. Materials used to form thin film deposited resistors include polysilicon, nichrome, tantalum and cermet. The sheet resistance of polysilicon depends on its doping and covers a range from about 20 to 1E12 ohm/sq. Nichrome and tantalum have sheet resistance of about 10 to 1000 ohm/sq and the range for cermet is about 30 to 2500 ohm/sq. About 0.2 to 0.3 microns of a rung are required for the conductive section that could make contact and the rung can be 1 micron or less. The width of a thin film deposited resistor would not be much less than 0.2 microns. Thus the length to width ratio of a deposited resistor, which is the number of squares, is not likely to be larger than about four. Nevertheless, a rung resistance of thousands of ohms is easily achievable. If the difference in measured line to line resistances, arising when different number of rungs make contact, is to always be large and thus easily discernible than the number of rungs on a resistance ladder cannot be too large. In any case if the increment in rung length or step size is chosen to correspond to about a standard deviation in spacing or misalignment than six rungs are more than sufficient. For ladders of that size and for rung resistance of thousands of ohms, the smallest line to line resistance differences can be hundreds of ohms.

While the invention has been particularly shown and described with reference to the preferred embodiments thereof, it will be understood by those skilled in the art that various changes in form and detail may be made without departing from the spirit and scope of the invention.

What is claimed is:

1. A method to measure spacing and misalignment comprising:

providing a partially processed semiconductor wafer containing a first insulating layer;

forming three equally spaced, parallel first level conductive lines on said first insulating layer with staircase patterns projecting both out of and into the inner edges of the outer lines;

depositing a second insulating layer;

opening step contact vias through said second insulating layer over the steps of said staircase patterns such that for each said step the inner edge of said step contact via coincides with the inner edge of said step;

opening contact pad vias through said second insulating layer over said outer lines;

filling the step contact vias and the contact pad vias with conductive material;

forming a second level conductive line over said second insulating layer parallel to said first level conductive lines and over central of said first level conductive lines;

forming resistor ladder patterns projecting from both edges of said second level conductive line the rungs of said ladder patterns being of equal length and being composed of rung conductive sections with a resistor section interposed;

forming the center conductor contact pad electrically connected to said second level conductive line;

forming the right conductor contact pad over said contact pad via through the second insulator layer to the right said outer first level line;

forming the left conductor contact pad over said contact pad via through the second insulator layer to the left said outer first level line;

measuring the resistance between the center conductor pad and the right conductor pad, inferring from this the rungs of said resistor ladder pattern projecting from right edge of second level conductive line that make contact with said step contact vias of said outer first level conductive line on the right, and determining the bounds for the distance, SR, from said right outer first level conductive line to said second level conductive line;

measuring the resistance between the center conductor pad and the left conductor pad, inferring from this the rungs of said resistor ladder pattern projecting from left edge of second level conductive line that make contact with said step contact vias of said outer first level conductive line on the left, and determining the bounds for the distance, SL, from said left outer first level conductive line to said second level conductive line;

calculating the bounds for the spacing of said first level conductive lines from $(SR+SL)/2$;

calculating the misalignment between the central said first level conductive line and said second level conductive line from $(SR-SL)/2$.

2. The method of claim 1 wherein the first and second insulating layers are composed of silicon oxide, silicon nitride or silicon oxynitride.

3. The method of claim 1 wherein the first and second level conductive lines, the rung conductive sections, the staircase patterns and the center, right and left conductor contact pads are composed of polysilicon, Al, Cu, Ag, Au, W, Mo, Ti, Co, TiN, MoSi2, WSi2, CoSi2 or TiSi2.

4. The method of claim 1 wherein the nominal spacing of the first level conductive lines is between about 0.5 and about 5.0 micrometers.

5. The method of claim 1 wherein the width of the steps in the staircase patters is between about 0.5 and about 5.0 micrometers.

6. The method of claim 1 wherein the technique utilized to open the step contact vias results in nearly vertical sidewalls.

7. The method of claim 1 wherein the step contact vias and the contact pad vias are filled with plugs composed of W, TiN, Al or polysilicon.

8. The method of claim 1 wherein the sheet resistance of the rung resistor section is between about 50 to about 1E12 ohms/sq.

9. The method of claim 1 wherein the material of the rung resistor section is polysilicon, nichrome, tantalum or cermet.

10. The method of claim 1 wherein the length to width ratio of the rung resistor sections is between 1 and 10.

11. A method to measure spacing and misalignment comprising:
   providing a partially processed semiconductor wafer containing a first insulating layer;
   forming three equally spaced, parallel first level conductive lines on said first insulating layer;
   depositing a second insulating layer;
   opening contact vias through said second insulating layer such that the inner edge of said contact vias coincides with the inner edges of the outer of said first level conductive lines. and opposite to rungs of resistor ladder structures emanating from second level conductive line to be formed subsequently;
   opening contact pad vias through said second insulating layer over said outer lines;
   filling the contact vias and the contact pad vias with conductive material;
   forming a second level conductive line over said second insulating layer parallel to said first level conductive lines and over central of said first level conductive lines;
   forming resistor ladder patterns projecting from both edges of said second level conductive line. the rungs of said ladder patterns being of incremented length and being composed of rung conductive sections with a rung resistor section interposed;
   forming the center conductor contact pad electrically connected to said second level conductive line;
   forming the right conductor contact pad over said contact pad via through the second insulator layer to the right said outer first level line;
   forming the left conductor contact pad over said contact pad via through the second insulator layer to the left said outer first level line;
   measuring the resistance between the center conductor pad and the right conductor pad, inferring from this the rungs of said resistor ladder pattern projecting from right edge of second level conductive line that make contact with said contact vias of said outer first level conductive line on the right, and determining the bounds for the distance, SR, from said right outer first level conductive line to said second level conductive line;
   measuring the resistance between the center conductor pad and the left conductor pad, inferring from this the rungs of said resistor ladder pattern projecting from left edge of second level conductive line that make contact with said contact vias of said outer first level conductive line on the left , and determining the bounds for the distance, SL, from said left outer First level conductive line to said second level conductive line;
   calculating the bounds for the spacing of said first level conductive lines from (SR+SL)/2;
   calculating the misalignment between the central said first level conductive line and said second level conductive line from (SR−SL)/2.

12. The method of claim 11 wherein the first and second insulating layers are composed of silicon oxide, silicon nitride or silicon oxynitride.

13. The method of claim 11 wherein the first and second level conductive lines, the rung conductive sections, the staircase patterns and the center, right and left conductor contact pads are composed of polysilicon, Al, Cu, Ag, Au, W, Mo, Ti, Co, TiN, MoSi2, WSi2, CoSi2 or TiSi2.

14. The method of claim 11 wherein the nominal spacing of the first level conductive lines is between about 0.5 and about 5.0 micrometers.

15. The method of claim 11 wherein the width of the contact vias is between about 0.1 and about 5.0 micrometers.

16. The method of claim 11 wherein the technique utilized to open the contact vias results in nearly vertical sidewalls.

17. The method of claim 11 wherein the step contact vias and the contact pad vias are filled with plugs composed of W, TiN, Al or polysilicon.

18. The method of claim 11 wherein the sheet resistance of the rung resistor section is between about 50 to about 1E12 ohms/sq.

19. The method of claim 11 wherein the material of the rung resistor section is polysilicon, nichrome, tantalum or cermet.

20. The method of claim 11 wherein the length to width ratio of the rung resistor sections is between 1 and 10.

21. A method to measure spacing comprising
   providing a partially processed semiconductor wafer containing an insulating layer;
   forming two parallel first level conductive lines on said insulating layer with a staircase pattern projecting both out of and into the inner edge of one of said conductive lines;
   forming a resistor ladder pattern projecting from the inner edge of the other of said conductive lines, the rungs of said ladder patterns being of equal length and being composed of rung conductive sections with a resistor section interposed;
   forming conductor contact pads electrically connected to said conductive lines;
   measuring the resistance between said conductor pads, inferring from this the rungs of said resistor ladder pattern that make contact with said steps of said staircase pattern, and determining the bounds for the distance between said conductive lines.

22. The method of claim 21 wherein the insulating layer is composed of silicon oxide, silicon nitride or silicon oxynitride.

23. The method of claim 21 wherein the conductive lines, the rung conductive sections, the staircase patterns and the conductor contact pads are composed of polysilicon, Al, Cu, Ag, Au, W, Mo, Ti, Co, TiN, MoSi2, WSi2, CoSi2 or TiSi2.

24. The method of claim 21 wherein the nominal spacing of the conductive lines is between about 0.1 and about 5.0 micrometers.

25. The method of claim 21 wherein the width of the steps in the staircase pattern is between about 0.5 and about 5.0 micrometers.

26. The method of claim 21 wherein the sheet resistance of the rung resistor section is between about 50 to about 1E12 ohms/sq.

27. The method of claim 21 wherein the material of the rung resistor section is polysilicon, nichrome, tantalum or cermet.

28. The method of claim 21 wherein the length to width ratio of the rung resistor sections is between 1 and 10.

29. A method to measure spacing comprising:

providing a partially processed semiconductor wafer containing an insulating layer;

forming two conductive lines on said insulating layer;

forming a resistor ladder pattern projecting from the inner edge of one of said conductive lines, the rungs of said ladder pattern being of incremented length and being composed of rung conductive sections with a rung resistor section interposed;

forming conductor contact pads electrically connected to said conductive lines;

measuring the resistance between said conductor pads, inferring from this the rungs of said resistor ladder pattern projecting from the edge of one of the conductive lines that make contact with the other of said conductive lines, and determining the bounds for the distance between said conductive lines.

30. The method of claim 29 wherein the insulating layer is composed of silicon oxide, silicon nitride or silicon oxynitride.

31. The method of claim 29 wherein the conductive lines, the rung conductive sections and the conductor contact pads are composed of polysilicon, Al, Cu, Ag, Au, W, Mo, Ti, Co, TiN, MoSi2, WSi2, CoSi2 or TiSi2.

32. The method of claim 29 wherein the nominal spacing of the conductive lines is between about 0.5 and about 5.0 micrometers.

33. The method of claim 29 wherein the sheet resistance of the rung resistor section is between about 50 to about 1E12 ohms/sq.

34. The method of claim 29 wherein the material of the rung resistor section is polysilicon, nichrome, tantalum or cermet.

35. The method of claim 29 wherein the length to width ratio of the rung resistor sections is between 1 and 10.

* * * * *